US012777782B2

(12) United States Patent
You

(10) Patent No.: US 12,777,782 B2
(45) Date of Patent: Oct. 27, 2026

(54) DISPLAY DEVICE AND METHOD OF MANUFACTURING THE SAME

(71) Applicant: Samsung Display Co., LTD., Yongin-si (KR)

(72) Inventor: Chungi You, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 372 days.

(21) Appl. No.: 18/545,388

(22) Filed: Dec. 19, 2023

(65) Prior Publication Data

US 2024/0381700 A1 Nov. 14, 2024

(30) Foreign Application Priority Data

May 11, 2023 (KR) ........................ 10-2023-0061244

(51) Int. Cl.

*H10K 59/122* (2023.01)
*H10K 59/12* (2023.01)
*H10K 59/80* (2023.01)

(52) U.S. Cl.

CPC ....... *H10K 59/122* (2023.02); *H10K 59/1201* (2023.02); *H10K 59/80517* (2023.02)

(58) Field of Classification Search

CPC .. H10K 59/122; H10K 59/1201; H10K 59/12; H10K 59/80517; H10K 59/80; H10K 59/124; H10K 59/131; H10K 59/8731; H10K 59/123; H10K 59/8052; H10K 50/19; H10K 50/84; H10K 50/844; H10K 50/00; H10K 71/60; H10K 77/10; H10K 71/621; H10K 71/40; H10K 71/233; H10K 2102/351; H10K 2102/331; H10K 2102/311; H10K 71/186; H10K 71/166; H10K 71/00; H10K 77/111

See application file for complete search history.

(56) References Cited

U.S. PATENT DOCUMENTS

2015/0212357 A1* 7/2015 Huang ................ G02F 1/13439 445/24
2021/0043705 A1 2/2021 Lim et al.
2022/0328582 A1* 10/2022 Lee ...................... H10K 59/121

FOREIGN PATENT DOCUMENTS

KR 10-0787461 B1 12/2007
KR 10-0793314 B1 1/2008
KR 10-0884791 B1 2/2009

(Continued)

*Primary Examiner* — Nikolay K Yushin

(74) *Attorney, Agent, or Firm* — Womble Bond Dickinson (US) LLP

(57) ABSTRACT

A display device includes a substrate including a first light emitting area, a second light emitting area adjacent to the first light emitting area, and a non-light emitting area between the first and second light emitting areas; a via insulating layer on the substrate and defining a trench recessed from an upper surface in the non-light emitting area; a pixel electrode in the first light emitting area and the second light emitting area and on the via insulating layer, and including: a first metal layer including titanium and/or titanium nitride; a second metal layer on the first metal layer and including a metal material; and a third metal layer on the second metal layer and including titanium nitride; and a pixel defining layer on the via insulating layer and the pixel electrode, exposing at least a portion of the pixel electrode, and defining an opening to the trench.

19 Claims, 15 Drawing Sheets

(56) References Cited

FOREIGN PATENT DOCUMENTS

| | | | | |
|---|---|---|---|---|
| KR | 10-0220210047104 | * | 4/2021 | ............. H01L 27/32 |
| KR | 10-2021-0111981 A | | 9/2021 | |

* cited by examiner

DISPLAY DEVICE AND METHOD OF MANUFACTURING THE SAME

CROSS-REFERENCE TO RELATED APPLICATION(S)

The present application claims priority to Korean Patent Application No. 10-2023-0061244, filed on May 11, 2023, in the Korean Intellectual Property Office, the entire content of which is herein incorporated by reference.

BACKGROUND

1. Field

Aspects of embodiments relate to a display device and a method of manufacturing the same.

2. Description of the Related Art

Recently, a head-mounted display (HMD) including a display device has been developed. The head-mounted display is a glasses-type monitor device of virtual reality (VR) or augmented reality (AR) that is worn in a form of glasses, a helmet, or the like and focuses on a distance close to a user's eyes. The head-mounted display may provide an image displayed on the display device to the user's eyes through a lens.

A high-resolution micro light emitting diode display device may be applied to the head-mounted display. The high-resolution micro light emitting diode display device may be an organic light emitting diode on silicon (OLEDos) formed using a silicon wafer-based semiconductor process.

The above information disclosed in this Background section is only for enhancement of understanding of the background of the invention and therefore it may contain information that does not form the prior art.

SUMMARY

Aspects of embodiments of the present disclosure are directed to a display device with improved display quality, and methods of manufacturing the same.

According to some embodiments, there is provided a display device including: a substrate including a first light emitting area, a second light emitting area adjacent to the first light emitting area, and a non-light emitting area between the first light emitting area and the second light emitting area; a via insulating layer on the substrate and defining a trench recessed from an upper surface of the via insulating layer in the non-light emitting area; a pixel electrode in the first light emitting area and the second light emitting area and on the via insulating layer, and including: a first metal layer including at least one of titanium (Ti) or titanium nitride (TiN); a second metal layer on the first metal layer and including a metal material; and a third metal layer on the second metal layer and including titanium nitride; and a pixel defining layer on the via insulating layer and the pixel electrode, exposing at least a portion of the pixel electrode, and defining an opening to the trench.

In some embodiments, the pixel electrode includes: a first area overlapping the pixel defining layer in a plan view; and a second area exposed by the pixel defining layer, and a thickness of a portion of the third metal layer overlapping the second area is thinner than a thickness of a portion of the third metal layer overlapping the first area.

In some embodiments, the thickness of the portion of the third metal layer overlapping the second area is about 30 Å to about 60 Å.

In some embodiments, the pixel defining layer includes: a first pixel defining layer on the via insulating layer and the pixel electrode; a second pixel defining layer on the first pixel defining layer; and a third pixel defining layer on the second pixel defining layer.

In some embodiments, each of the first pixel defining layer and the third pixel defining layer includes an inorganic material different from the second pixel defining layer.

In some embodiments, each of the first pixel defining layer and the third pixel defining layer includes silicon nitride ($SiN_x$), and the second pixel defining layer includes silicon oxide ($SiO_x$).

In some embodiments, the first pixel defining layer covers a side surface of the pixel electrode.

In some embodiments, a side surface of the first pixel defining layer protrudes more in a direction toward a center of the pixel electrode than a side surface of the second pixel defining layer, and the side surface of the second pixel defining layer protrudes more in the direction toward the center of the pixel electrode than a side surface of the third pixel defining layer.

In some embodiments, the display device further includes: a light emitting layer on the pixel electrode and the pixel defining layer, wherein the light emitting layer includes a charge generation layer disconnected in the non-light emitting area by the trench.

In some embodiments, the display device further includes: a common electrode on the light emitting layer, wherein the common electrode is entirely in the first light emitting area, the second light emitting area, and the non-light emitting area.

In some embodiments, the substrate includes: a base substrate defining a plurality of grooves and including a silicon wafer; and a plurality of pixel circuits each accommodated in the plurality of grooves.

According to some embodiments, there is provided a method of manufacturing a display device, the method including: forming a via insulating layer on a substrate, the substrate including a first light emitting area, a second light emitting area adjacent to the first light emitting area, and a non-light emitting area between the first light emitting area and the second light emitting area; forming a pixel electrode in each of the first light emitting area and the second light emitting area on the via insulating layer; forming a preliminary pixel defining layer on the via insulating layer and the pixel electrode; forming an opening penetrating the preliminary pixel defining layer and a trench recessed from an upper surface of the via insulating layer and connected to the opening by removing a portion of each of the preliminary pixel defining layer and the via insulating layer in the non-light emitting area; and forming a pixel defining layer exposing at least a portion of the pixel electrode by removing a portion of the preliminary pixel defining layer.

In some embodiments, the forming of the pixel electrode includes: forming a preliminary first metal layer on the via insulating layer; forming a preliminary second metal layer on the preliminary first metal layer; forming a preliminary third metal layer on the preliminary second metal layer; and forming a first metal layer, a second metal layer, and a third metal layer by removing a portion of each of the preliminary first metal layer, the preliminary second metal layer and the preliminary third metal layer.

In some embodiments, the first metal layer includes at least one of titanium or titanium nitride, the second metal layer includes silver, and the third metal layer includes titanium nitride.

In some embodiments, the forming of the preliminary pixel defining layer includes: forming a preliminary first pixel defining layer on the via insulating layer and the pixel electrode; forming a preliminary second pixel defining layer on the preliminary first pixel defining layer; and forming a preliminary third pixel defining layer on the preliminary second pixel defining layer.

In some embodiments, the forming of the pixel defining layer includes: forming a third pixel defining layer by removing a portion of the preliminary third pixel defining layer; forming a second pixel defining layer including a side surface that protrudes more in a direction toward a center of the pixel electrode than a side surface of the third pixel defining layer by removing a portion of the preliminary second pixel defining layer; and forming a first pixel defining layer including a side surface that protrudes more in the direction toward the center of the pixel electrode than the side surface of the second pixel defining layer by removing a portion of the preliminary first pixel defining layer.

In some embodiments, each of the first pixel defining layer and the third pixel defining layer includes an inorganic material different from the second pixel defining layer.

In some embodiments, each of the first pixel defining layer and the third pixel defining layer includes silicon nitride, and the second pixel defining layer includes silicon oxide.

In some embodiments, the pixel electrode includes: a first area overlapping the pixel defining layer in a plan view; and a second area exposed by the pixel defining layer.

In some embodiments, in the forming of the first pixel defining layer, and a portion of the third metal layer overlapping the second area is removed, and a portion of the third metal layer overlapping the second area is formed to have a thinner thickness than a portion of the third metal layer overlapping the first area.

In a display device according to some embodiments of the present disclosure, the display device may include a pixel electrode including a first metal layer including at least one of titanium and/or titanium nitride, a second metal layer including silver, and a third metal layer including titanium nitride. As the third metal layer includes titanium nitride, the third metal layer may not be crystallized, and a material included in the second metal layer may not be eluted through the third metal layer. Accordingly, a short circuit between the pixel electrode and the common electrode may be avoided, and a dark spot phenomenon may be improved (e.g., reduced). In addition, since the pixel electrode may be formed through dry etching, a roughness of the pixel electrode may be improved (e.g., reduced).

DETAILED DESCRIPTION

Figure 1:
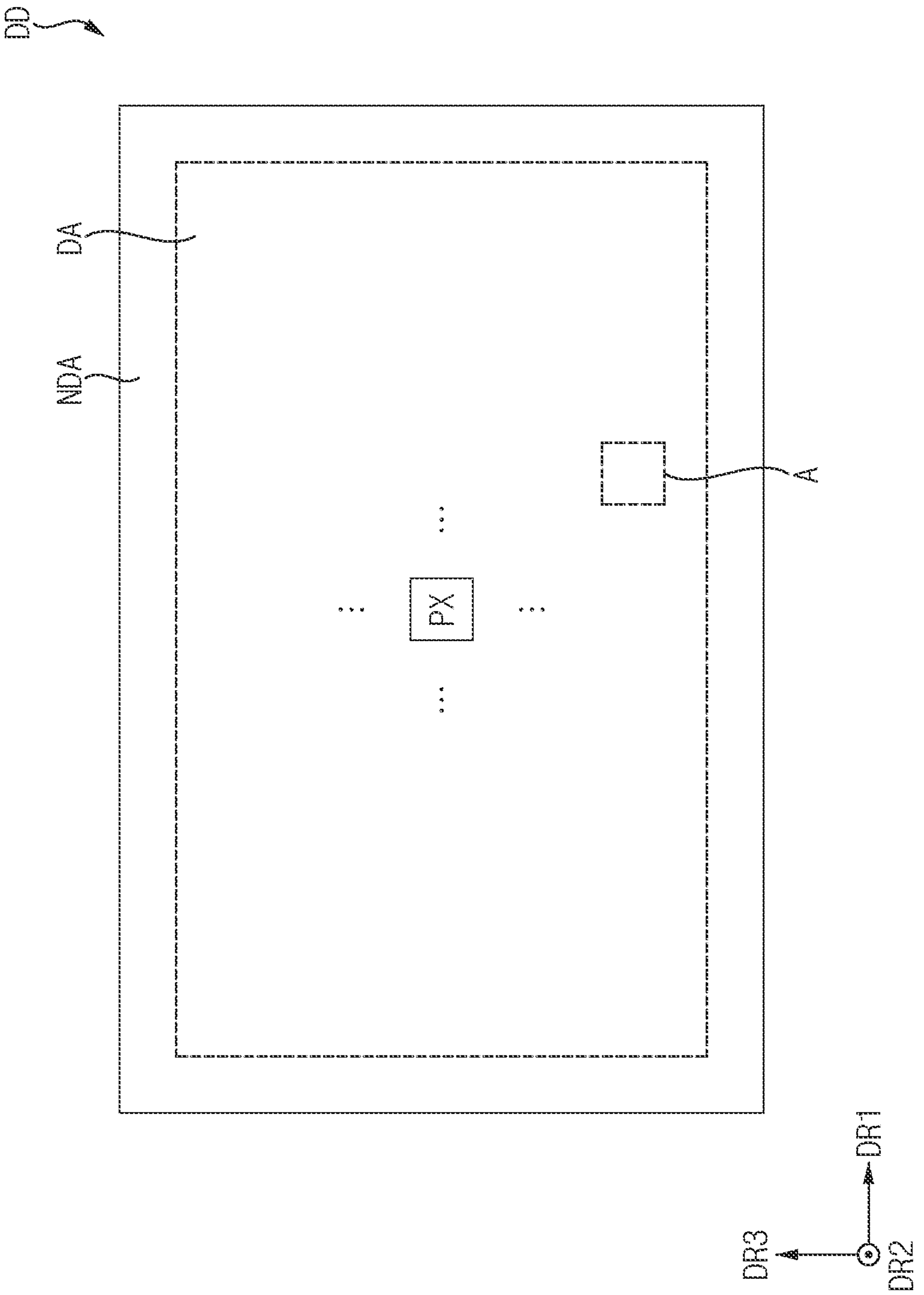
FIG. 1 is a plan view illustrating a display device according to some embodiments of the present disclosure.

Hereinafter, some embodiments of the present disclosure will be described in more detail with reference to the accompanying drawings. The same reference numerals are used for the same components in the drawings, and redundant descriptions of the same components may not be repeated.

FIG. 1 is a plan view illustrating a display device according to some embodiments of the present disclosure.

Referring to FIG. 1, a display device DD according to some embodiments of the present disclosure includes a display area DA and a non-display area NDA.

The display area DA may be an area that displays an image. In the display area DA, a plurality of pixels PX may be repeatedly arranged along a first direction DR1 and a second direction DR2 intersecting the first direction DR1 in a plan view. For example, the second direction DR2 may be perpendicular to the first direction DR1. Each of the pixels PX may be defined as a minimum light emitting unit that displays light.

Signal lines such as gate lines and data lines may be disposed in the display area DA. The signal lines may be connected to each of the pixels PX. Each of the pixels PX may receive a gate signal, data signal, and/or the like from the signal lines. Accordingly, in the display area DA, an image may be displayed in a third direction DR3 intersecting each of the first direction DR1 and the second direction DR2. For example, the third direction DR3 may be perpendicular to each of the first direction DR1 and the second direction DR2.

The non-display area NDA may be an area that does not display an image. The non-display area NDA may be arranged around the display area DA. For example, the non-display area NDA may entirely surround the display area DA. Drivers for displaying the image in the display area DA may be disposed in the non-display area NDA.

In some embodiments, the display device DD is a micro light emitting diode display device including a micro light emitting diode as a light emitting element. However, the present disclosure is not limited thereto. In some examples, the display device DD may be an organic light emitting diode display device including an organic light emitting diode as a light emitting element.

Figure 2:
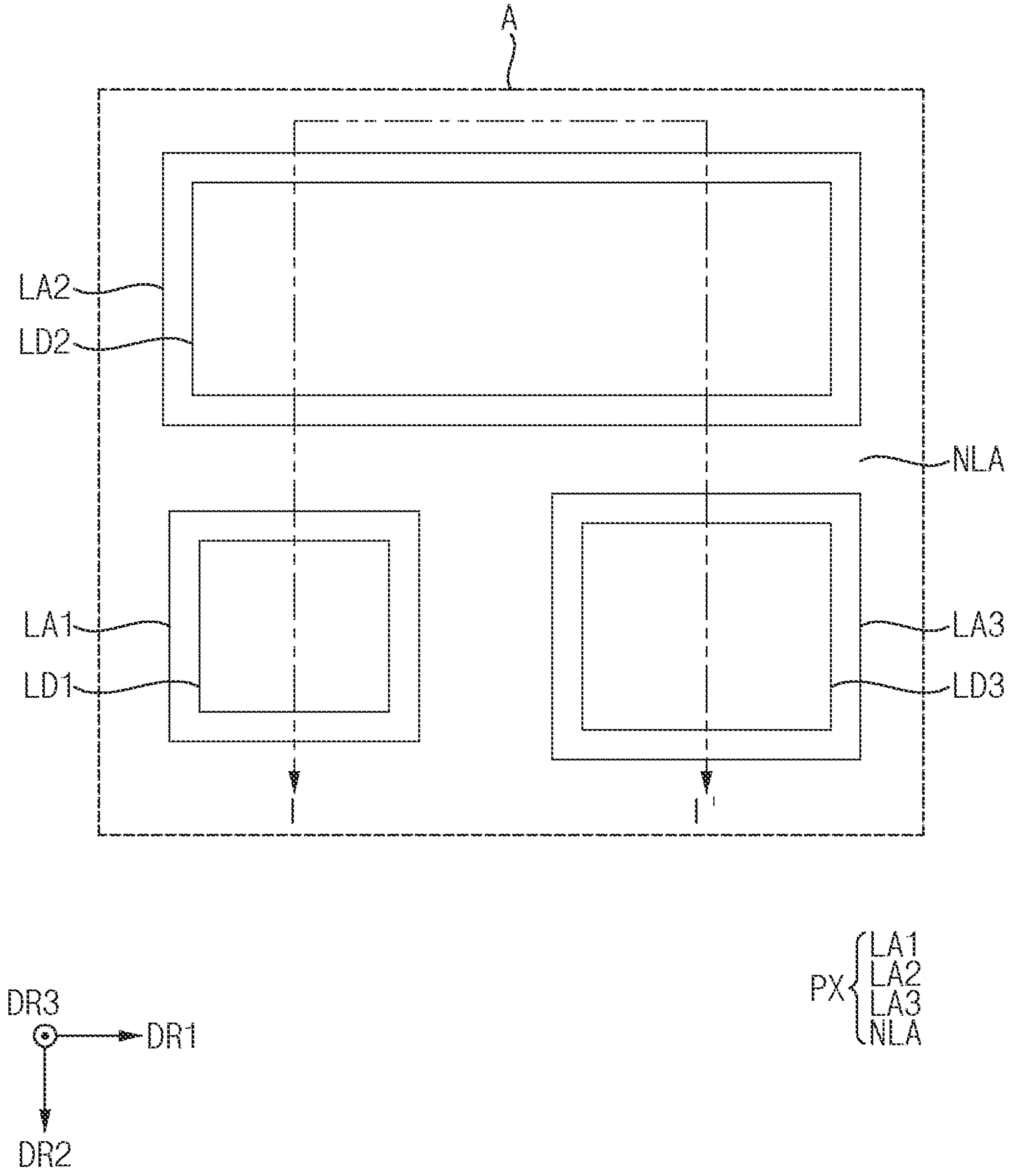
FIG. 2 is an enlarged plan view of the area A of FIG. 1, according to some embodiments of the present disclosure.

FIG. 2 is an enlarged plan view of the area A of FIG. 1, according to some embodiments of the present disclosure. For example, FIG. 2 may be an enlarged plan view of an example of the pixel PX included in the display device DD.

Referring to FIGS. 1 and 2, each of the pixels PX may include a first light emitting area LA1, a second light emitting area LA2, a third light emitting area LA3, and a non-light emitting area NLA.

Each of the first, second, and third light emitting areas LA1, LA2, and LA3 may be an area that emits light. A first light emitting element LD1 may be disposed in the first light emitting area LA1, a second light emitting element LD2 may be disposed in the second light emitting area LA2, and a third light emitting element LD3 may be disposed in the third light emitting area LA3.

In some embodiments, the first light emitting element LD1 emits first light, the second light emitting element LD2 may emit second light, and the third light emitting element LD3 may emit third light. The first light emitting area LA1 may emit the first light emitted from the first light emitting element LD1. The second light emitting area LA2 may emit the second light emitted from the second light emitting element LD2. The third light emitting area LA3 may emit the third light emitted from the third light emitting element LD3. For example, the first light may be light in a red wavelength band, the second light may be light in a blue wavelength band, and the third light may be light in a green wavelength band, but the present disclosure is not limited thereto.

In some other embodiments, each of the first, second, and third light emitting elements LD1, LD2, and LD3 emits fourth light. The first light emitting area LA1 may convert the fourth light emitted from the first light emitting element LD1 into the first light, and may emit the first light. The second light emitting area LA2 may convert the fourth light emitted from the second light emitting element LD2 into the second light, and may emit the second light. The third light emitting area LA3 may convert the fourth light emitted from the third light emitting element LD3 into the third light, and may emit the third light. For example, the fourth light may be white light, but the present disclosure is not limited thereto.

In some embodiments, the first light emitting area LA1, the second light emitting area LA2 and the third light emitting area LA3 have different areas. For example, an area of the second light emitting area LA2 may be larger than an area of each of the first light emitting area LA1 and the third light emitting area LA3. In addition, the area of the third light emitting area LA3 may be larger than the area of the first light emitting area LA1. However, the present disclosure is not limited thereto. In some examples, the first light emitting area LA1, the second light emitting area LA2, and the third light emitting area LA3 may have substantially a same area as each other.

In some embodiment, the first light emitting area LA1 and the third light emitting area LA3 are arranged in a same row. In addition, the second light emitting area LA2 may be arranged in a different row from the first light emitting area LA1 and the third light emitting area LA3. For example, the third light emitting area LA3 may be adjacent to the first light emitting area LA1 in the first direction DR1, and each of the first light emitting area LA1 and the third light emitting area LA3 may be adjacent to the second light emitting area LA2 in the second direction DR2. However, the present disclosure is not limited thereto. In some examples, the first light emitting area LA1, the second light emitting area LA2, and the third light emitting area LA3 may have various arrangements in a plan view.

The non-light emitting area NLA may be an area that does not emit light. The first, second, and third light emitting areas LA1, LA2, and LA3 may be defined by the non-light emitting area NLA. The non-light emitting area NLA may surround each of the first, second, and third light emitting areas LA1, LA2, and LA3. That is, the non-light emitting area NLA may be located between the first, second, and third light emitting areas LA1, LA2, and LA3 that are adjacent to (e.g., closest to) each other.

In FIG. 2, each of the pixels PX is illustrated as including three light emitting areas LA1, LA2, and LA3, but the present disclosure is not limited thereto. In some examples, each of the pixels PX may include four or more light emitting areas.

In addition, in FIG. 2, each of the first, second, and third light emitting areas LA1, LA2, and LA3 is illustrated as having a quadrangular planar shape, but the present disclosure is not limited thereto. In some examples, each of the first, second, and third light emitting areas LA1, LA2, and LA3 may have a polygonal, circular, elliptical, or irregular planar shape other than quadrangular.

Figure 3:
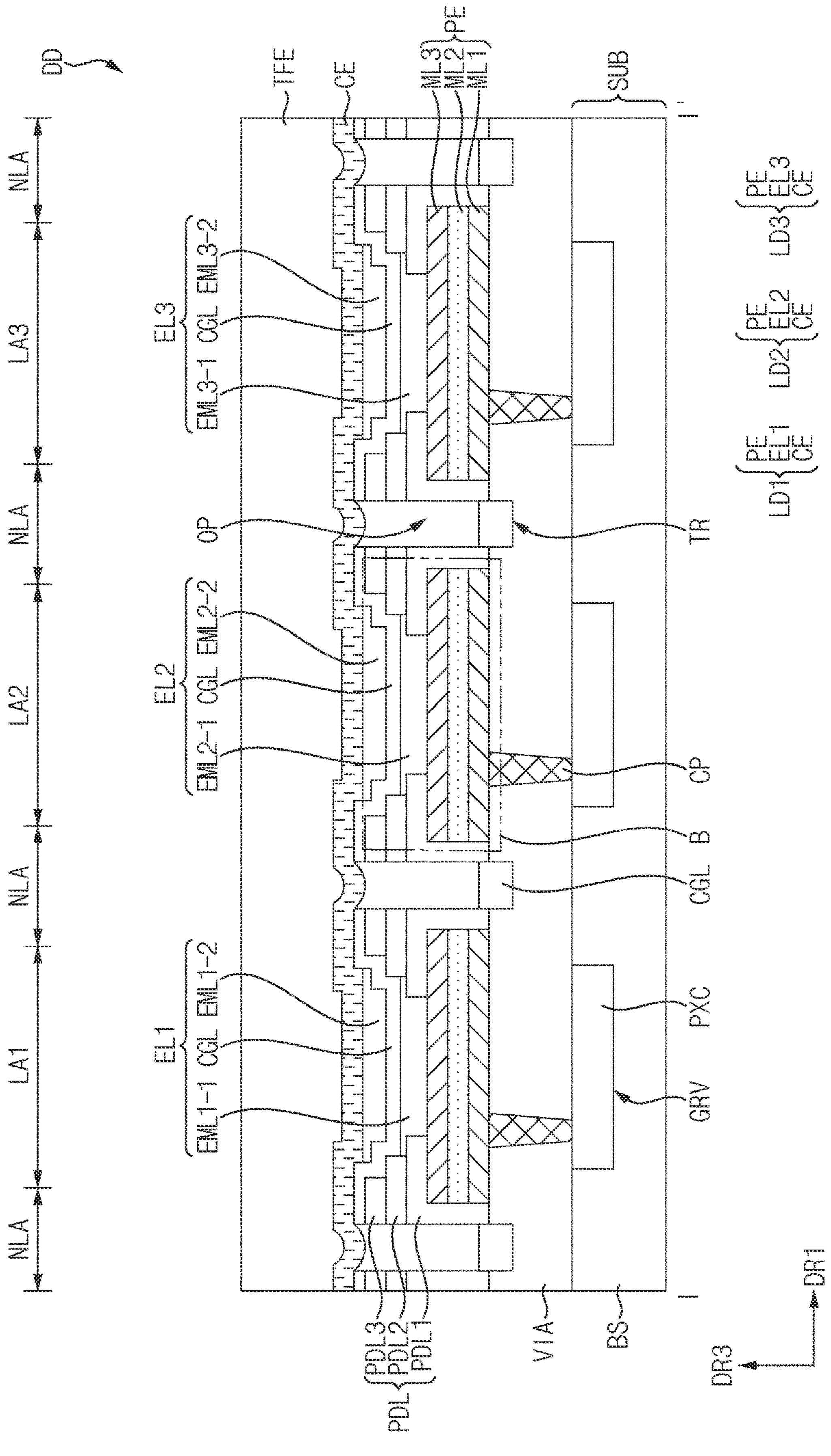
FIG. 3 is a cross-sectional view taken along the line I-I' of FIG. 2, according to some embodiments of the present disclosure.
Figure 4:
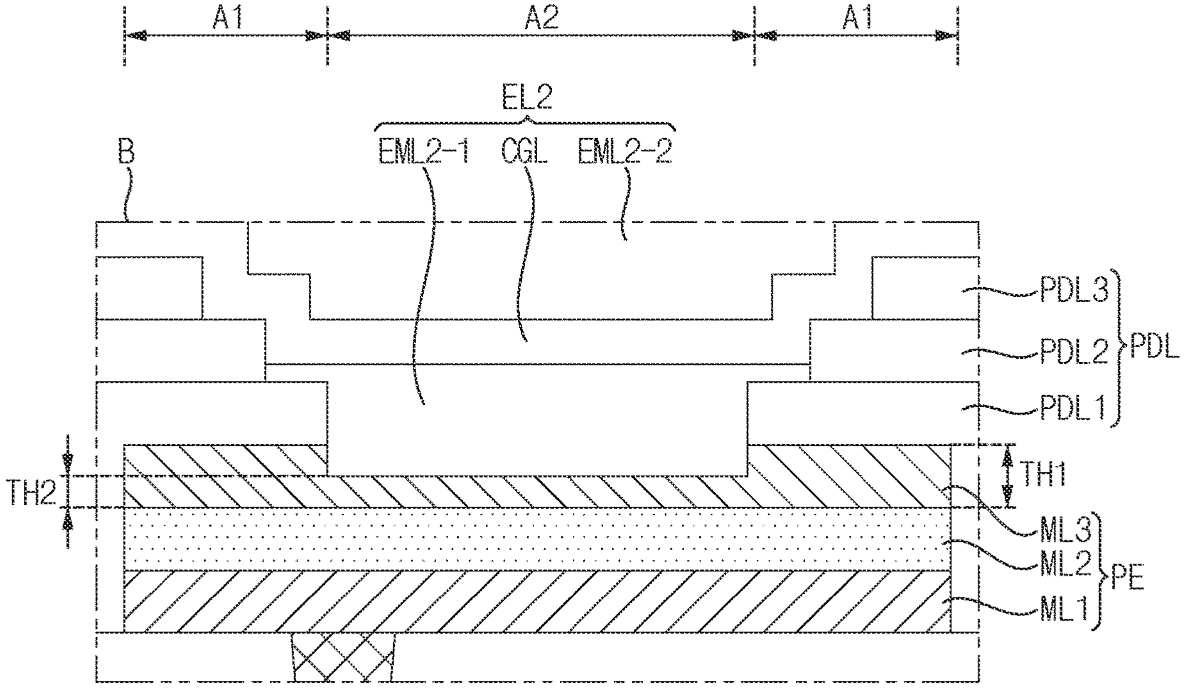
FIG. 4 is an enlarged cross-sectional view of the area B of FIG. 3, according to some embodiments of the present disclosure.

FIG. 3 is a cross-sectional view taken along the line I-I' of FIG. 2, according to some embodiments of the present disclosure. FIG. 4 is an enlarged cross-sectional view of the area B of FIG. 3, according to some embodiments of the present disclosure. For example, FIG. 4 may be an enlarged cross-sectional view of a pixel electrode PE included in the display device DD.

Referring to FIGS. 1, 2, 3, and 4, the display device DD may include a substrate SUB, a via insulating layer VIA, a pixel connection pattern CP, the first, second, and third light emitting elements LD1, LD2, and LD3, a pixel defining layer PDL, and an encapsulation layer TFE.

Here, the first light emitting element LD1 may include the pixel electrode PE, a first light emitting layer EL1 and a common electrode CE. The second light emitting element LD2 may include the pixel electrode PE, a second light emitting layer EL2 and the common electrode CE. The third light emitting element LD3 may include the pixel electrode PE, a third light emitting layer EL3 and the common electrode CE.

In addition, the first light emitting layer EL1 may include a first lower light emitting layer EML1-1, a charge generation layer CGL and a first upper light emitting layer EML1-2. The second light emitting layer EL2 may include a second lower light emitting layer EML2-1, the charge generation layer CGL and a second upper light emitting layer EML2-2. The third light emitting layer EL3 may include a third lower light emitting layer EML3-1, the charge generation layer CGL and a third upper light emitting layer EML3-2.

In some embodiments, the substrate SUB is a semiconductor circuit board. The substrate SUB may include a base substrate BS and a plurality of pixel circuits PXC. The base substrate BS may include a silicon wafer. The base substrate BS may be a support member that supports other components of the display device DD. In addition, the base substrate BS may define a plurality of grooves GRV. The grooves GRV may overlap the first, second, and third light emitting areas LA1, LA2, and LA3.

The pixel circuits PXC may be accommodated in the grooves GRV. Each of the pixel circuits PXC may include at least one transistor. In addition, each of the pixel circuits PXC may further include at least one capacitor.

The via insulating layer VIA may be disposed on the substrate SUB. In some embodiments, the via insulating layer VIA defines a trench TR recessed from an upper surface of the via insulating layer VIA. That is, the via insulating layer VIA may define the trench TR recessed from the upper surface of the via insulating layer VIA in a direction opposite to the third direction DR3. The trench TR may overlap the non-light emitting area NLA.

In addition, the via insulating layer VIA may define a contact hole penetrating the via insulating layer VIA. The contact hole may overlap the first, second, and third light emitting areas LA1, LA2, and LA3. The via insulating layer VIA may include an organic material. Examples of the organic material may include photoresist, polyacrylic resin, polyimide resin, acrylic resin, or the like. These may be used alone or in combination with each other.

The pixel connection pattern CP may be filled in the contact hole. The pixel connection pattern CP may be electrically connected to the pixel circuit PXC. For example, the pixel connection pattern CP may include a conductive material.

The pixel electrode PE may be disposed on the via insulating layer VIA. The pixel electrode PE may overlap the first, second, and third light emitting areas LA1, LA2, and LA3. The pixel electrode PE may be electrically connected to the pixel circuit PXC through the pixel connection pattern CP. Accordingly, the pixel electrode PE may receive an anode voltage from the pixel circuit PXC. For example, the pixel electrode PE may function (e.g., operate) as an anode.

The pixel electrode PE may have a multilayer structure. In some embodiments, the pixel electrode PE has a three-layer structure. The pixel electrode PE may include a first metal layer ML1, a second metal layer ML2 and a third metal layer ML3. However, the present disclosure is not limited thereto. In some examples, the pixel electrode PE may have a structure of two or less layers, or four or more layers.

The first metal layer ML1 may be disposed on the via insulating layer VIA. The first metal layer ML1 may include metal, alloy, and/or the like. In some embodiments, the first metal layer ML1 includes titanium (Ti). In some other embodiments, the first metal layer ML1 includes titanium nitride (TiN).

The second metal layer ML2 may be disposed on the first metal layer ML1. The second metal layer ML2 may include metal, alloy, and/or the like. In some embodiments, the second metal layer ML2 includes silver (Ag).

The third metal layer ML3 may be disposed on the second metal layer ML2. The third metal layer ML3 may include metal, alloy, and/or the like. In some embodiments, the third metal layer ML3 includes titanium nitride.

The pixel electrode PE may include a first area A1 overlapping the pixel defining layer PDL in a plan view and a second area A2 not overlapping the pixel defining layer PDL in a plan view. In some embodiments, a thickness of a portion of the pixel electrode PE overlapping the second area A2 is thinner than a thickness of a portion of the pixel electrode PE overlapping the first area A1. In other words, a thickness TH2 of a portion of the third metal layer ML3 overlapping the second area A2 may be thinner than a thickness TH1 of a portion of the third metal layer ML3 overlapping the first area A1. For example, the thickness TH2 of the portion of the third metal layer ML3 overlapping the second area A2 may be about 30 Å to about 60 Å, but the present disclosure is not limited thereto. In some examples, the thickness TH2 of the portion of the third metal layer ML3 overlapping the second area A2 may be about 30 Å or less.

The pixel defining layer PDL may be disposed on the via insulating layer VIA and the pixel electrode PE. In some embodiments, the pixel defining layer PDL defines an opening OP penetrating the pixel defining layer PDL. The opening OP may be connected to the trench TR of the via insulating layer VIA. That is, the opening OP may overlap the non-light emitting area NLA. In addition, the pixel defining layer PDL may define an opening exposing at least a portion of the pixel electrode PE. Accordingly, the pixel defining layer PDL may cover the pixel electrode PE in the first area A1, and may expose the pixel electrode PE in the second area A2.

The pixel defining layer PDL may have a multilayer structure. In some embodiments, the pixel defining layer PDL has a three-layer structure. The pixel defining layer PDL may include a first pixel defining layer PDL1, a second pixel defining layer PDL2 and a third pixel defining layer PDL3. However, the present disclosure is not limited thereto. In some examples, the pixel defining layer PDL may have a structure of two or less layers or four or more layers.

The first pixel defining layer PDL1 may be disposed on the via insulating layer VIA and the pixel electrode PE overlapping the first area A1. The first pixel defining layer PDL1 may include an inorganic material. In some embodiments, the first pixel defining layer PDL1 includes silicon nitride ($SiN_x$). The first pixel defining layer PDL1 may cover side surfaces of the pixel electrode PE. That is, the first pixel defining layer PDL1 may cover ends of the pixel electrode PE overlapping the first area A1 and the side surfaces of the pixel electrode PE. As the first pixel defining layer PDL1 includes silicon nitride, oxidation of the second metal layer ML2 including silver may be prevented or substantially reduced.

The second pixel defining layer PDL2 may be disposed on a portion of the first pixel defining layer PDL1. In other words, a side surface of the first pixel defining layer PDL1 may further protrude in a direction toward a center of the pixel electrode PE (i.e., in a direction parallel to the substrate SUB) than a side surface of the second pixel defining layer PDL2. That is, the first pixel defining layer PDL1 and the second pixel defining layer PDL2 may form a step. The second pixel defining layer PDL2 may include an inorganic material. The second pixel defining layer PDL2 may include a different inorganic material from the first pixel defining layer PDL1. In some embodiments, the second pixel defining layer PDL2 includes silicon oxide ($SiO_x$).

The third pixel defining layer PDL3 may be disposed on a portion of the second pixel defining layer PDL2. In other words, the side surface of the second pixel defining layer PDL2 may further protrude in the direction toward the center of the pixel electrode PE (i.e., in the direction parallel to the substrate SUB) than a side surface of the third pixel defining layer PDL3. That is, the second pixel defining layer PDL2 and the third pixel defining layer PDL3 may form a step. The third pixel defining layer PDL3 may include an inorganic material. The third pixel defining layer PDL3 may include a different inorganic material from the second pixel defining layer PDL2. In addition, the third pixel defining layer PDL3 may include a same inorganic material as the first pixel defining layer PDL1. In some embodiments, the third pixel defining layer PDL3 includes silicon nitride.

The first lower light emitting layer EML1-1 may be disposed on the pixel electrode PE overlapping the first light emitting area LA1, the second lower light emitting layer EML2-1 may be disposed on the pixel electrode PE overlapping the second light emitting area LA2, and the third lower light emitting layer EML3-1 may be disposed on the pixel electrode PE overlapping the third light emitting area LA3. That is, each of the first, second, and third lower emitting layers EML1-1, EML2-1 and EML3-1 may be disposed on the pixel electrode PE exposed by the opening of the pixel defining layer PDL.

The first lower light emitting layer EML1-1 may emit the first light, and may include an organic material that emits the first light. The second lower light emitting layer EML2-1 may emit the second light, and may include an organic material that emits the second light. The third lower light emitting layer EML3-1 may emit the third light, and may include an organic material that emits the third light. For example, each of the first, second, and third lower emitting layers EML1-1, EML2-1 and EML3-1 may include an organic emitting layer including an organic material and an auxiliary layer. The auxiliary layer may include at least one of a hole injection layer, a hole transport layer, an electron transport layer and an electron injection layer.

The charge generation layer CGL may be disposed on the first, second, and third lower light emitting layers EML1-1, EML2-1 and EML3-1 and the pixel defining layer PDL. In addition, the charge generation layer CGL may fill at least a portion of the trench TR of the via insulating layer VIA and the opening OP of the pixel defining layer PDL. That is, the charge generation layer CGL may be entirely disposed in the first, second, and third light emitting areas LA1, LA2, and LA3 and the non-light emitting area NLA. The charge generation layer CGL may include an n-type charge generation layer that provides electrons to the first, second, and third lower light emitting layers EML1-1, EML2-1 and EML3-1 and a p-type charge generation layer that provides holes to the first, second, and third upper light emitting layers EML1-2, EML2-2 and EML3-2.

In some embodiments, the charge generation layer CGL is disconnected in the non-light emitting area NLA by the trench TR. That is, the charge generation layer CGL may be disconnected between the first, second, and third light emitting areas LA1, LA2, and LA3 that are adjacent to (e.g., closest to) each other. For example, the charge generation layer CGL may be disconnected between the first light emitting area LA1 and the second light emitting area LA2 that are adjacent to (e.g., closest to) each other, may be disconnected between the second light emitting area LA2 and the third light emitting area LA3 that are adjacent to (e.g., closest to) each other, and may be disconnected between the third light emitting area LA3 and the first light emitting area LA1 that are adjacent to (e.g., closest to) each other.

When the charge generation layer CGL extends without being disconnected (i.e., extends continuously without any breaks) in the first, second, and third light emitting areas LA1, LA2, and LA3 and the non-light emitting area NLA, a leakage current may occur between the first, second, and third light emitting areas LA1, LA2, and LA3 that are adjacent to (e.g., closest to) each other. That is, as the charge generation layer CGL is disconnected by the trench TR in the non-light emitting area NLA, the leakage current that may occur between the first, second, and third light emitting areas LA1, LA2, and LA3 that are adjacent to (e.g., closest to) each other may be minimized or substantially reduced.

The first upper light emitting layer EML1-2 may be disposed on the charge generation layer CGL overlapping the first light emitting area LA1, the second upper light emitting layer EML2-2 may be disposed on the charge generation layer CGL overlapping the second light emitting area LA2, and the third upper light emitting layer EML3-2 may be disposed on the charge generation layer CGL overlapping the third light emitting area LA3. That is, the first upper light emitting layer EML1-2 may overlap the first lower light emitting layer EML1-1, the second upper light emitting layer EML2-2 may overlap the second lower light emitting layer EML2-1, and the third upper light emitting layer EML3-2 may overlap the third lower light emitting layer EML3-1.

The first upper light emitting layer EML1-2 may emit the first light, and may include an organic material that emits the first light. The second upper light emitting layer EML2-2 may emit the second light, and may include an organic material that emits the second light. The third upper light emitting layer EML3-2 may emit the third light, and may include an organic material that emits the third light. For example, each of the first, second, and third upper light emitting layers EML1-2, EML2-2 and EML3-2 may include an organic light emitting layer including an organic material and an auxiliary layer. The auxiliary layer may include at least one of a hole injection layer, a hole transport layer, an electron transport layer and an electron injection layer.

In FIG. 3, each of the first, second, and third light emitting layers EL1, EL2, and EL3 is illustrated as having a structure in which two light emitting layers are stacked, but the present disclosure is not limited thereto. In some examples, each of the first, second, and third light emitting layers EL1, EL2 and EL3 may include a structure in which three or more light emitting layers are stacked.

The common electrode CE may be disposed on the first, second, and third upper light emitting layers EML1-2, EML2-2 and EML3-2. The common electrode CE may be entirely disposed in the first, second, and third light emitting areas LA1, LA2, and LA3 and the non-light emitting area NLA. That is, the common electrode CE may extend continuously without being disconnected (i.e., may extend continuously without any breaks) in the first, second, and third light emitting areas LA1, LA2, and LA3 and the non-light emitting area NLA. The common electrode CE may include a conductive material. Examples of the conductive material may include lithium, calcium, aluminum, silver, magnesium, or the like. These may be used alone or in combination with each other. For example, the common electrode CE may function (e.g., operate) as a cathode.

Accordingly, the first light emitting element LD1 including the pixel electrode PE, the first light emitting layer EL1 and the common electrode CE may be disposed in the first light emitting area LA1 on the substrate SUB. The second light emitting element LD2 including the pixel electrode PE, the second light emitting layer EL2 and the common electrode CE may be disposed in the second light emitting area LA2 on the substrate SUB. The third light emitting element LD3 including the pixel electrode PE, the third light emitting layer EL3 and the common electrode CE may be disposed in the third light emitting area LA3 on the substrate SUB.

The encapsulation layer TFE may be disposed on the common electrode CE. The encapsulation layer TFE may prevent impurities, moisture, external air, and/or the like from penetrating into the first, second, and third light emitting elements LD1, LD2, and LD3 from the outside, or substantially reduce incidences thereof. The encapsulation layer TFE may include at least one inorganic encapsulation layer and at least one organic encapsulation layer.

In the display device DD according to some embodiments of the present disclosure, the pixel electrode PE includes the first metal layer ML1 including at least one of titanium and titanium nitride, the second metal layer ML2 including silver, and the third metal layer ML3 including titanium nitride. As the third metal layer ML3 includes titanium nitride, the third metal layer ML3 may not be crystallized, and a material included in the second metal layer ML2 may not be eluted through the third metal layer ML3. Accordingly, a short circuit between the pixel electrode PE and the common electrode CE may be avoided, and a dark spot phenomenon may be improved (e.g., reduced). In addition, since the pixel electrode PE may be formed through dry etching, a roughness of the pixel electrode PE may be improved (e.g., reduced).

FIGS. 5 to 13 are cross-sectional views illustrating a method of manufacturing the display device of FIG. 3, according to some embodiments of the present disclosure. For example, FIG. 13 may be an enlarged cross-sectional view of area C of FIG. 12.

A method of manufacturing a display device described with reference to FIGS. 5 to 13 may be the same or substantially the same as a method of manufacturing the display device DD described with reference to FIGS. 1, 2, 3 and 4. Therefore, redundant descriptions may not be repeated or may be simplified.

Figure 5:
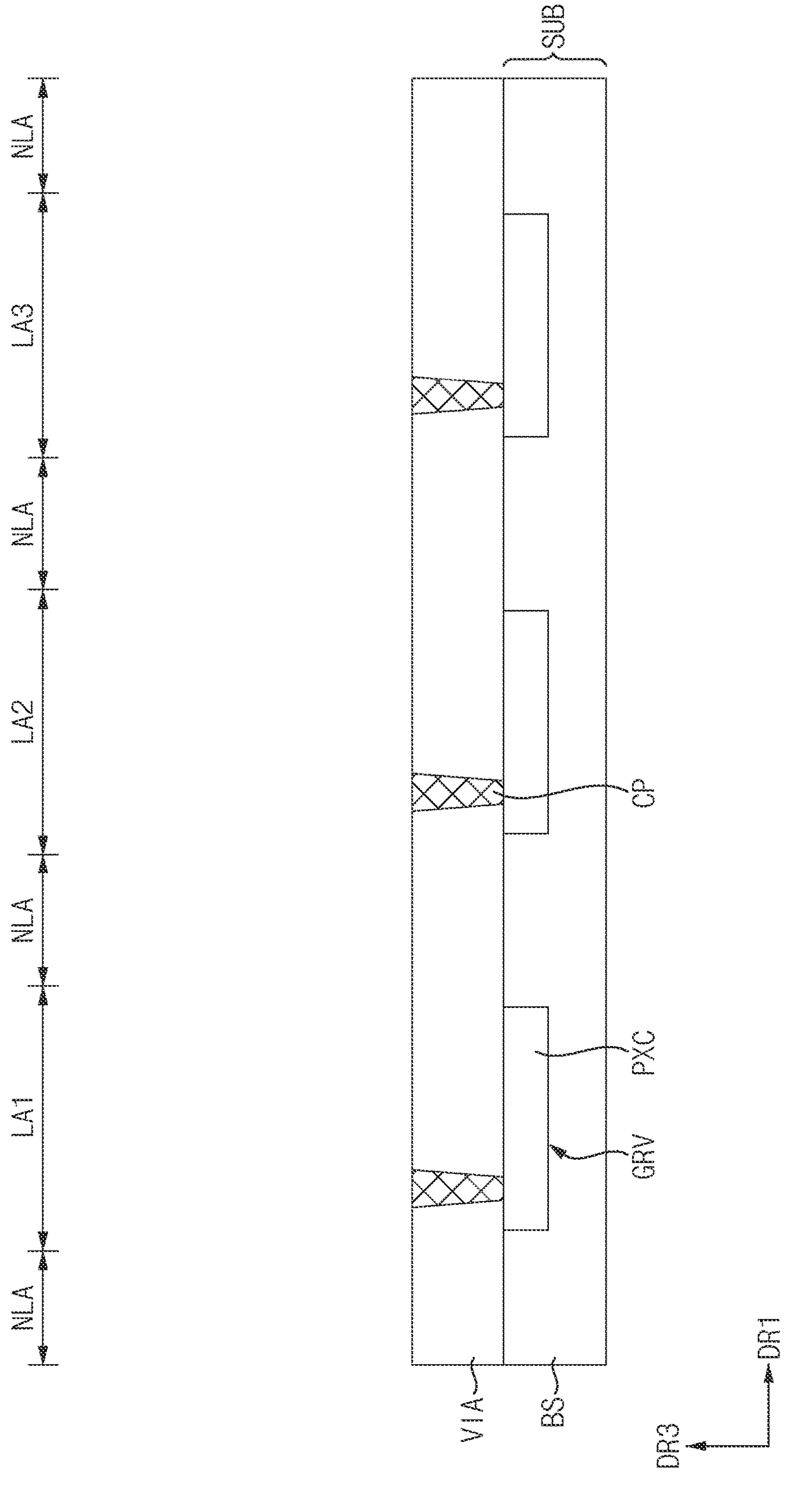
FIGS. 5 to 13 are cross-sectional views illustrating a method of manufacturing the display device of FIG. 3, according to some embodiments of the present disclosure.
Figure 6:
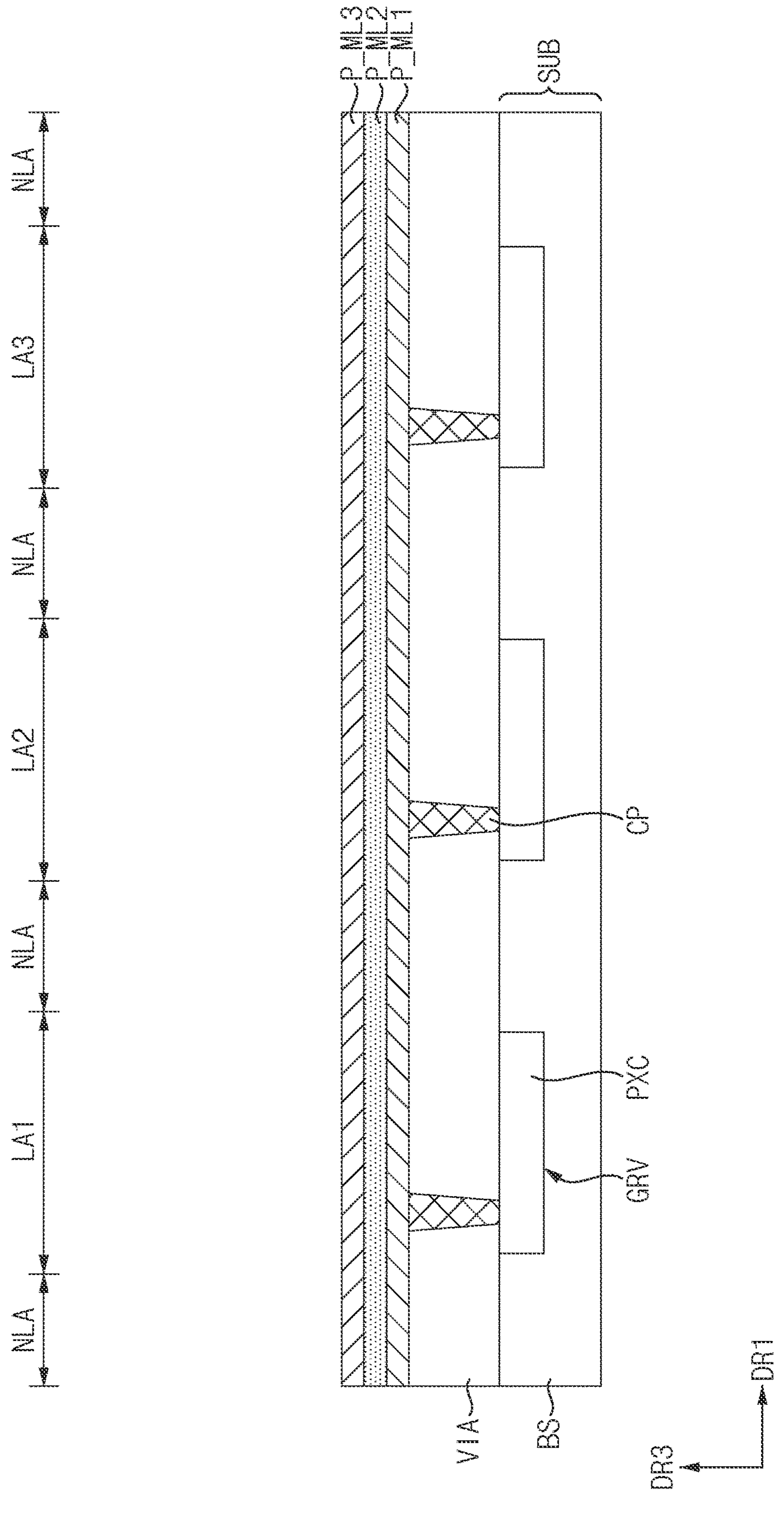

Referring to FIGS. 5 and 6, the substrate SUB may be provided. The substrate SUB may include the base substrate BS defining the grooves GRV. The base substrate BS may include a silicon wafer. The pixel circuits PXC may be formed in the grooves GRV.

The via insulating layer VIA may be formed on the substrate SUB. The contact hole penetrating the via insulating layer VIA may be formed in the via insulating layer VIA. The contact hole may be formed to overlap the first, second, and third light emitting areas LA1, LA2, and LA3. The pixel connection pattern CP may be filled in the contact hole.

A preliminary first metal layer P_ML1 may be formed on the via insulating layer VIA. In some embodiments, the preliminary first metal layer P_ML1 includes titanium. In some other embodiments, the preliminary first metal layer P_ML1 includes titanium nitride.

A preliminary second metal layer P_ML2 may be formed on the preliminary first metal layer P_ML1. In some embodiments, the second preliminary metal layer P_ML2 includes silver.

A preliminary third metal layer P_ML3 may be formed on the preliminary second metal layer P_ML2. In some embodiments, the third preliminary metal layer P_ML3 includes titanium nitride.

Figure 7:
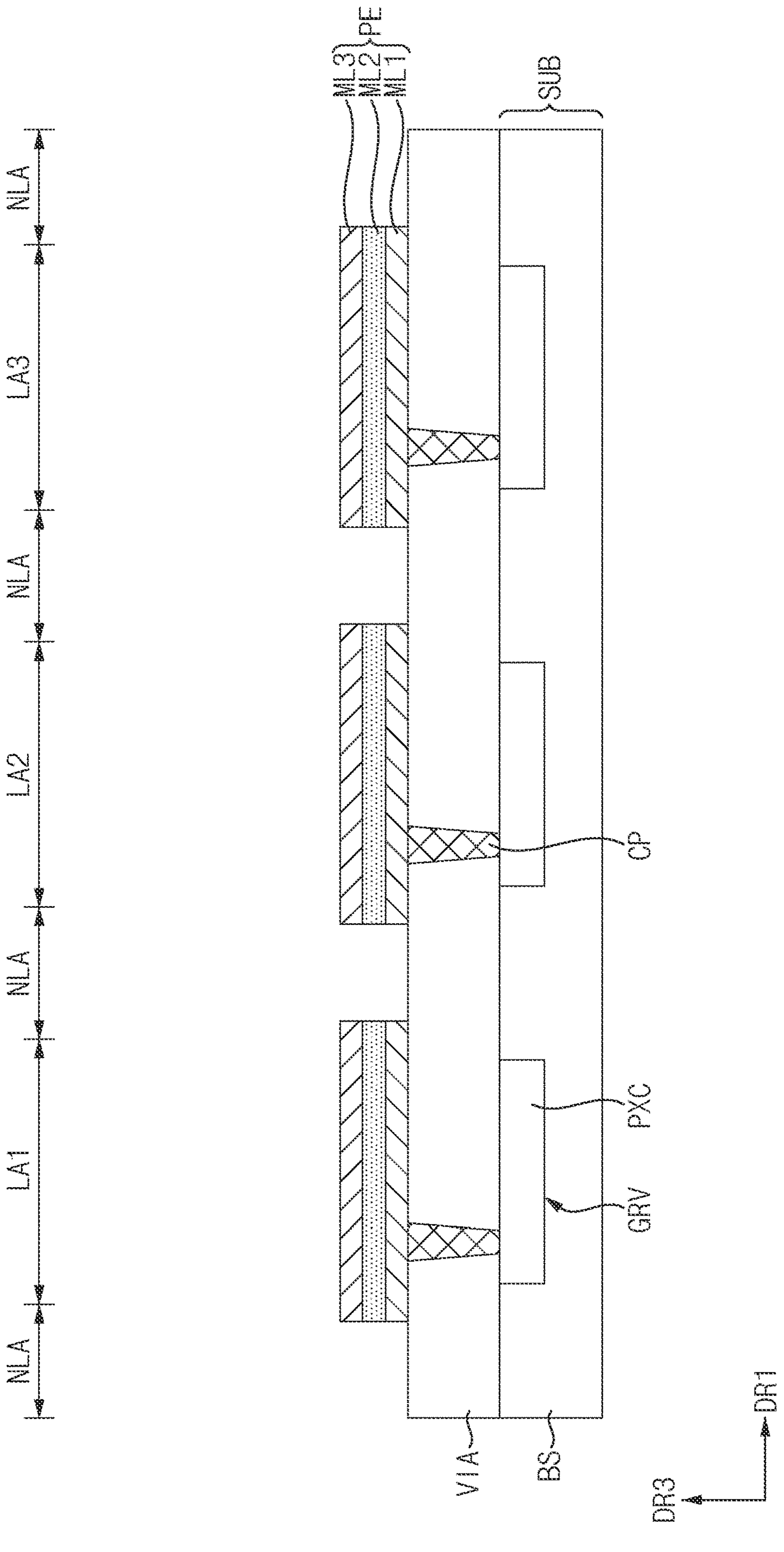

Referring to FIGS. 6 and 7, the first, second, and third metal layers ML1, ML2 and ML3 may be formed by removing a portion of each of the preliminary first, second, and third metal layers P_ML1, P_ML2 and P_ML3. Accordingly, the pixel electrode PE including the first, second, and third metal layers ML1, ML2 and ML3 may be formed to overlap the first, second, and third light emitting areas LA1, LA2, and LA3.

In some embodiments, the preliminary first, second, and third metal layers P_ML1, P_ML2 and P_ML3 are dry etched in batches to form the first, second, and third metal layers ML1, ML2 and ML3, respectively. As the preliminary first, second, and third metal layers P_ML1, P_ML2 and P_ML3 are dry etched to form the pixel electrode PE, the roughness of the pixel electrode PE may be reduced.

Figure 8:
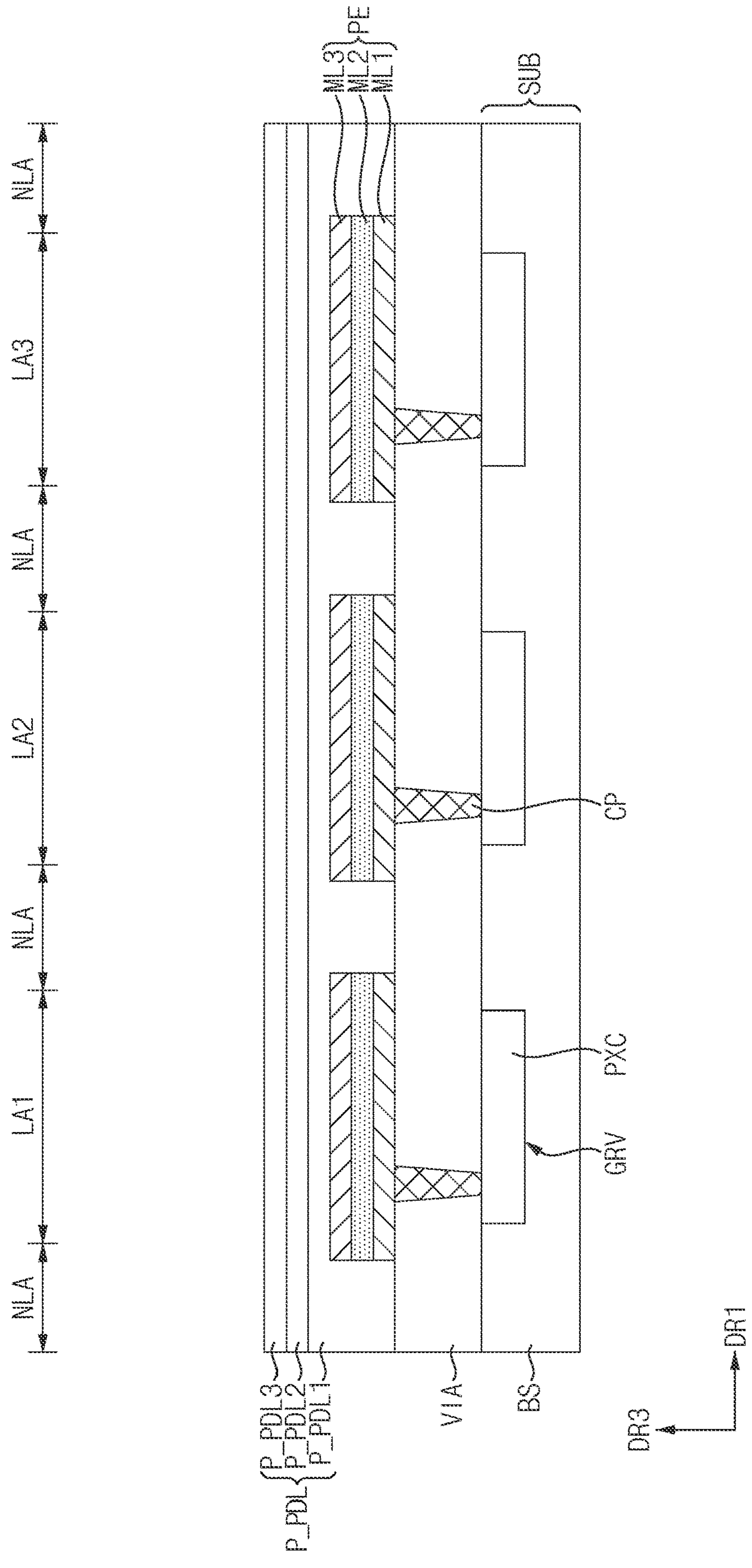

Referring to FIGS. 7 and 8, a preliminary first pixel defining layer P_PDL1 may be formed on the via insulating layer VIA and the pixel electrode PE. The preliminary first pixel defining layer P_PDL1 may entirely cover an upper surface and the side surfaces of the pixel electrode PE. In some embodiments, the preliminary first pixel defining layer P_PDL1 includes silicon nitride.

A preliminary second pixel defining layer P_PDL2 may be formed on the preliminary first pixel defining layer P_PDL1. The preliminary second pixel defining layer P_PDL2 may include a different inorganic material from the preliminary first pixel defining layer P_PDL1. In some embodiments, the preliminary second pixel defining layer P_PDL2 includes silicon oxide.

A preliminary third pixel defining layer P_PDL3 may be formed on the preliminary second pixel defining layer P_PDL2. The preliminary third pixel defining layer P_PDL3 may include a different inorganic material from the preliminary second pixel defining layer P_PDL2. In addition, the preliminary third pixel defining layer P_PDL3 may include a same inorganic material as the preliminary first pixel defining layer P_PDL1. In some embodiments, the preliminary third pixel defining layer P_PDL3 includes silicon nitride.

The preliminary first pixel defining layer P_PDL1, the preliminary second pixel defining layer P_PDL2 and the preliminary third pixel defining layer P_PDL3 may form a preliminary pixel defining layer P_PDL.

Figure 9:
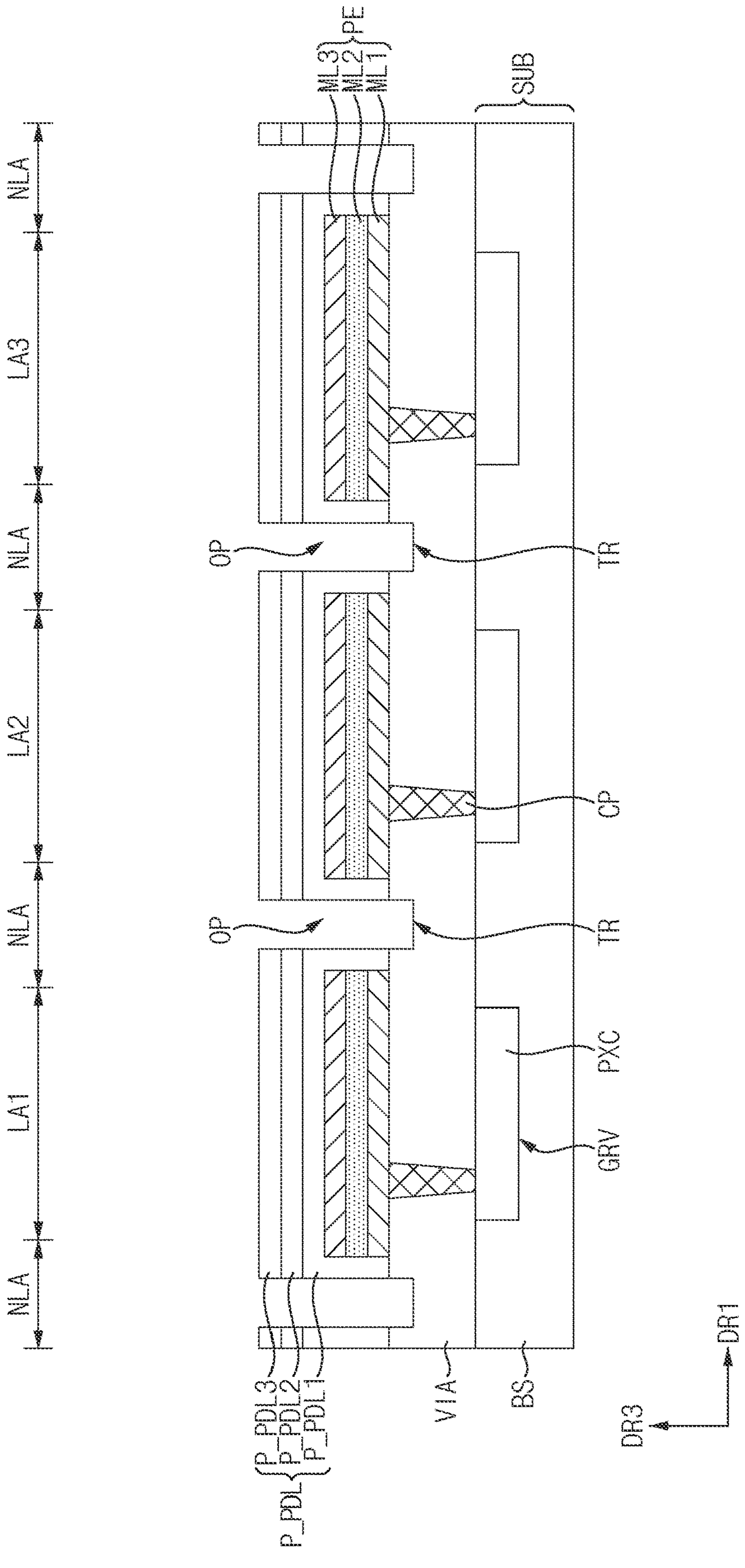
Figure 10:
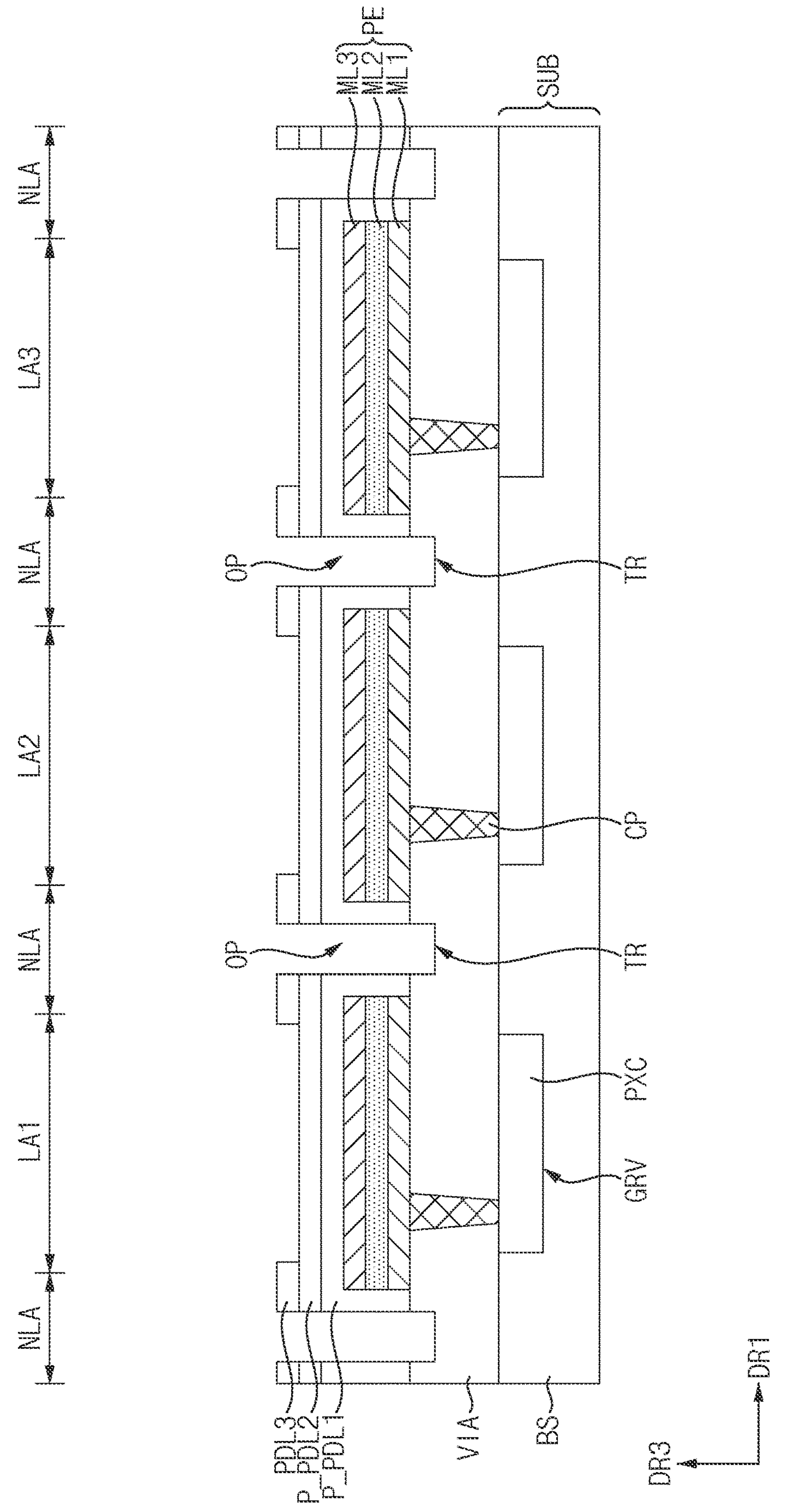
Figure 11:
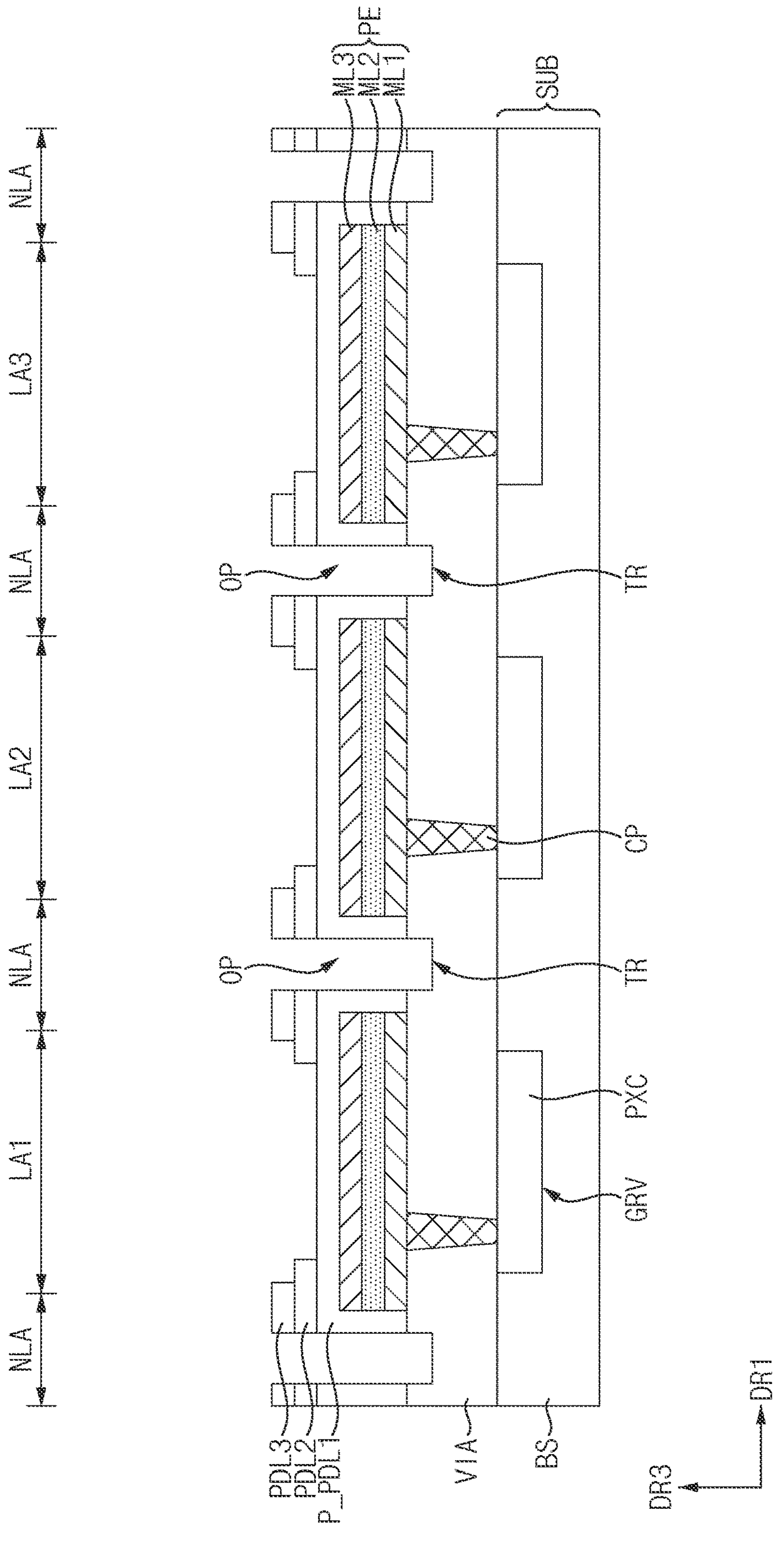
Figure 12:
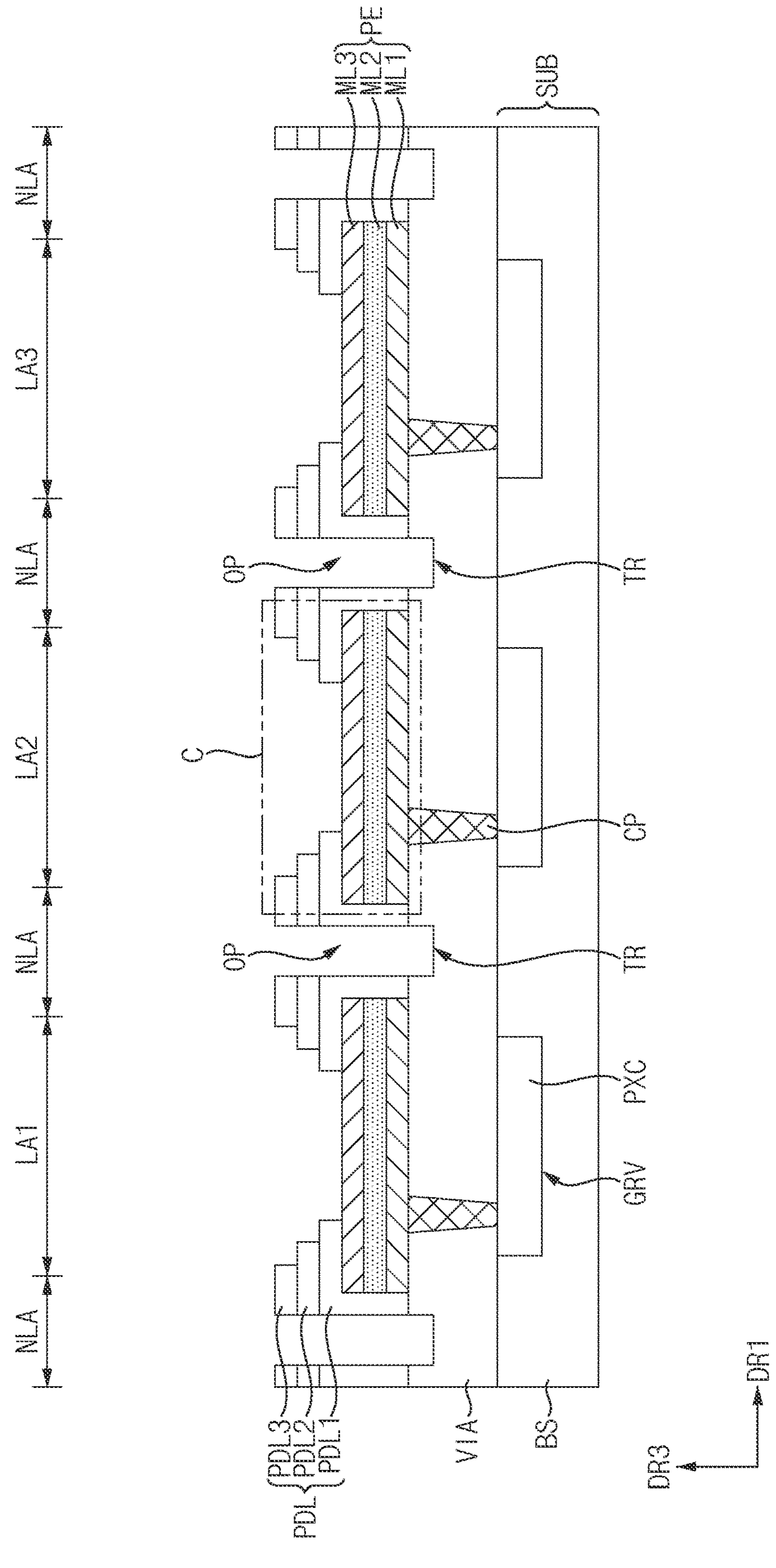
Figure 13:
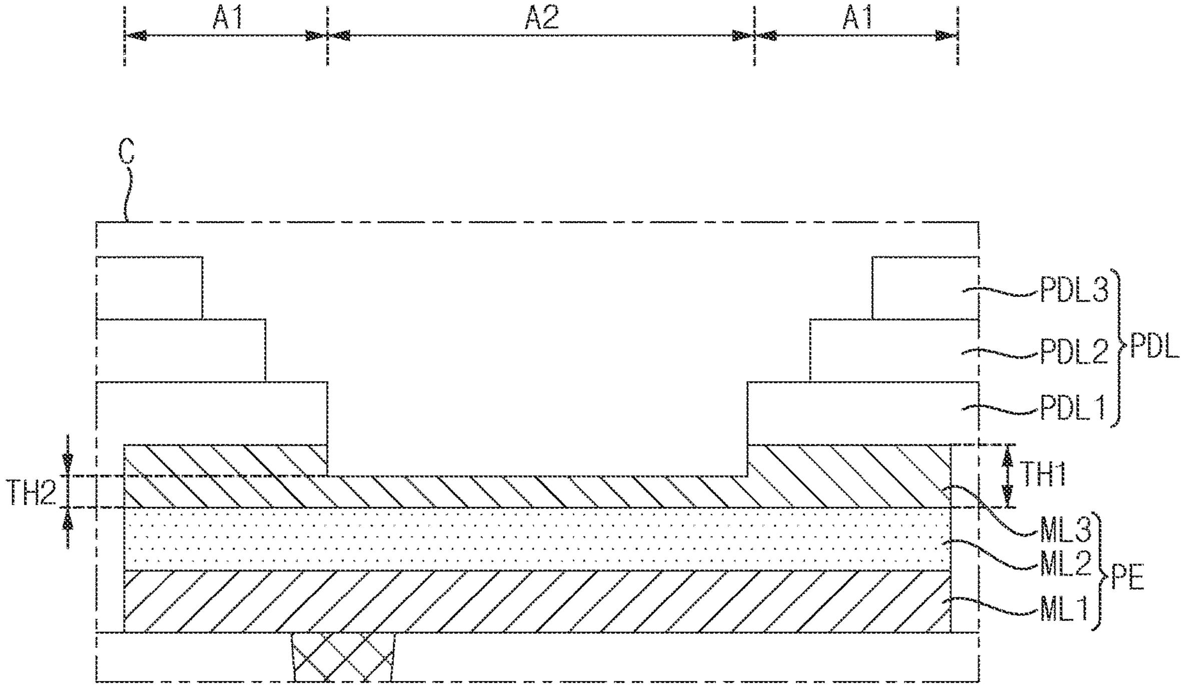

Referring to FIGS. 8 and 9, the opening OP penetrating the preliminary pixel defining layer P_PDL and the trench TR recessed from the upper surface of the via insulating layer VIA may be formed by removing a portion of each of the preliminary pixel defining layer P_PDL and the via insulating layer VIA. The opening OP and the trench TR may be connected to each other. The opening OP and the trench TR may overlap the non-light emitting area NLA.

Referring to FIGS. 9, 10, 11, 12 and 13, the third pixel defining layer PDL3 may be formed by removing a portion of the preliminary third pixel defining layer P_PDL3. The third pixel defining layer PDL3 may expose a portion of the preliminary second pixel defining layer P_PDL2.

The second pixel defining layer PDL2 may be formed by removing a portion of the preliminary second pixel defining layer P_PDL2 exposed by the third pixel defining layer PDL3. In some embodiments, the side surface of the second pixel defining layer PDL2 is formed to protrude more in the direction toward the center of the pixel electrode PE than the side surface of the third pixel defining layer PDL3. The second pixel defining layer PDL2 may expose a portion of the preliminary first pixel defining layer P_PDL1.

The first pixel defining layer PDL1 may be formed by removing a portion of the preliminary first pixel defining layer P_PDL1 exposed by the second pixel defining layer PDL2. In some embodiments, the side surface of the first pixel defining layer PDL1 is formed to protrude more in the direction toward the center of the pixel electrode PE than the side surface of the second pixel defining layer PDL2. The first pixel defining layer PDL1 may expose a portion of the pixel electrode PE.

In some embodiments, as the first pixel defining layer PDL1 is formed, a portion of the third metal layer ML3 exposed by the first pixel defining layer PDL1 is removed. That is, a portion of the third metal layer ML3 overlapping the second area A2 may be removed, and the thickness TH2 of the portion of the third metal layer ML3 overlapping the second area A2 may become thinner than the thickness TH1 of the portion of the third metal layer ML3 overlapping the first area A1. For example, the thickness TH2 of the portion of the third metal layer ML3 overlapping the second area A2 may be about 30 Å to about 60 Å, but the present disclosure is not limited thereto. In some examples, the thickness TH2 of the portion of the third metal layer ML3 overlapping the second area A2 may be about 30 Å or less.

Accordingly, the pixel defining layer PDL including the first, second, and third pixel defining layers PDL1, PDL2 and PDL3 may be formed.

Referring again to FIG. 3, the first, second, and third light emitting layers EL1, EL2 and EL3, the common electrode CE and the encapsulation layer TFE may be sequentially formed on the pixel electrode PE. Accordingly, the display device DD shown in FIG. 3 may be manufactured.

Figure 14:
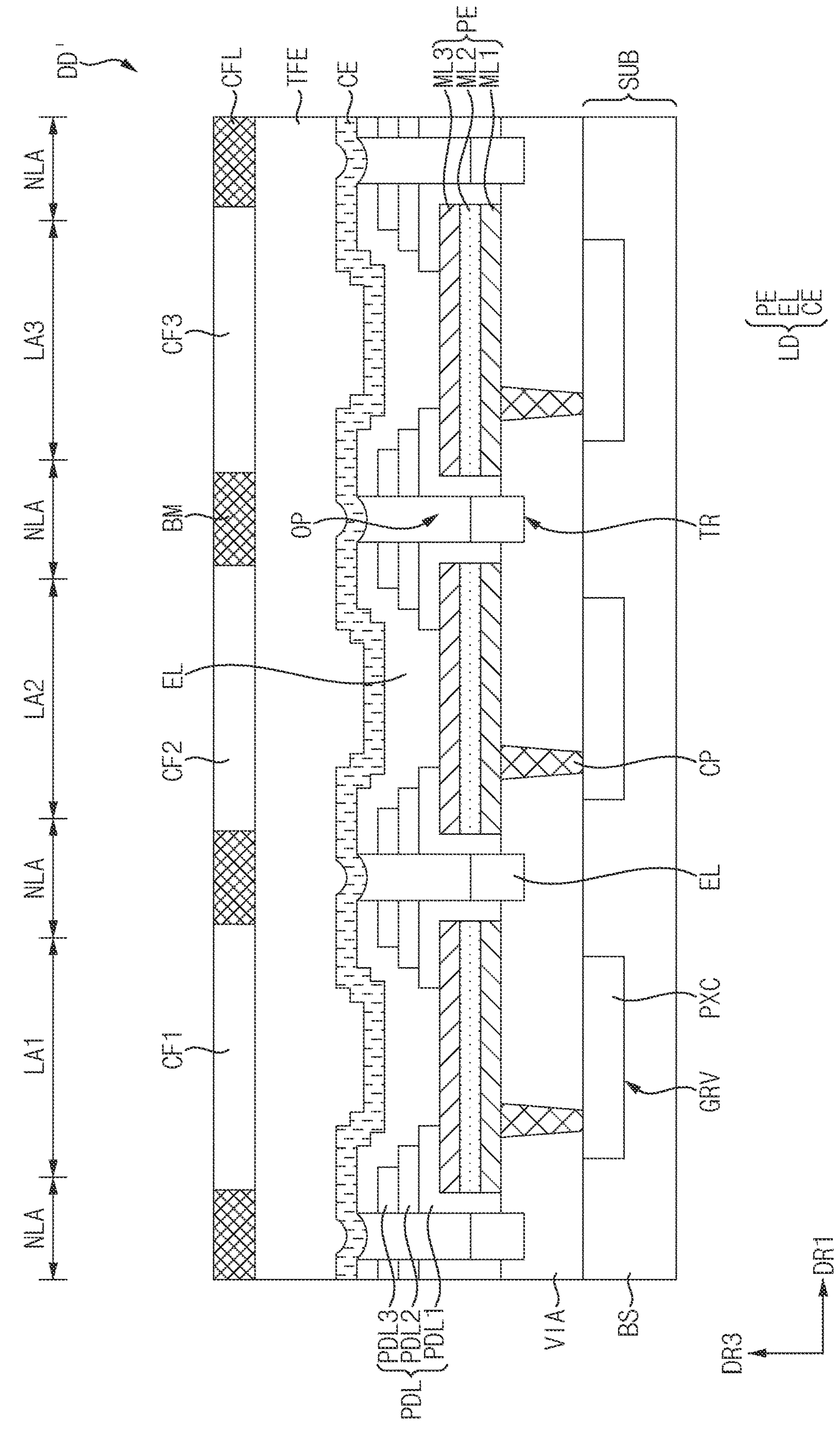
FIG. 14 is a cross-sectional view illustrating a display device according to some other embodiments of the present disclosure.
Figure 15:
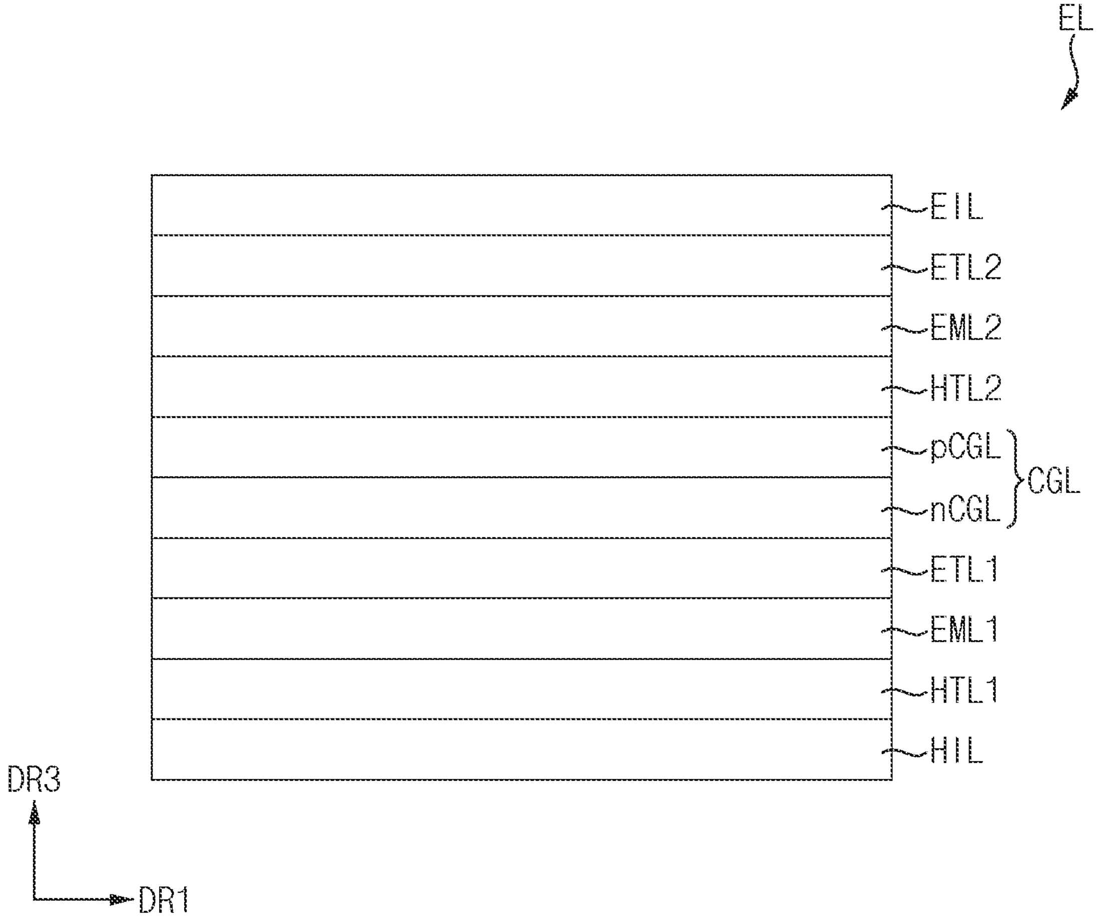
FIG. 15 is a cross-sectional view illustrating a light emitting layer included in the display device of FIG. 14, according to some embodiments of the present disclosure.

FIG. 14 is a cross-sectional view illustrating a display device according to some other embodiments of the present disclosure. FIG. 15 is a cross-sectional view illustrating a light emitting layer included in the display device of FIG.

14, according to some embodiments of the present disclosure. For example, FIG. 14 may correspond to the cross-sectional view of FIG. 3.

Hereinafter, descriptions overlapping those of the display device DD described with reference to FIGS. 1, 2, 3 and 4 may not be repeated or may be simplified.

Referring to FIGS. 14 and 15, a display device DD' may include a first light emitting area LA1, a second light emitting area LA2, a third light emitting area LA3 and a non-light emitting area NLA located between the first, second, and third light emitting areas LA1, LA2, and LA3 that are adjacent to (e.g., closest to) each other.

In addition, the display device DD' may include a substrate SUB, a via insulating layer VIA, a pixel connection pattern CP, a light emitting element LD, a pixel defining layer PDL, an encapsulation layer TFE and a color filter layer CFL. Here, the light emitting element LD may include a pixel electrode PE, a light emitting layer EL, and a common electrode CE.

The via insulating layer VIA may be disposed on the substrate SUB. The via insulating layer VIA may define a trench TR recessed from an upper surface of the via insulating layer VIA in the non-light emitting area NLA. In addition, the via insulating layer VIA may define a contact hole penetrating the via insulating layer VIA in each of the first, second, and third light emitting areas LA1, LA2, and LA3, and the pixel connection pattern CP may be filled in the contact hole.

The pixel electrode PE may be disposed in the first, second, and third light emitting areas LA1, LA2, and LA3 on the via insulating layer VIA. The pixel electrode PE may include a first metal layer ML1, a second metal layer ML2 disposed on the first metal layer ML1, and a third metal layer ML3 disposed on the second metal layer ML2.

In some embodiments, the first metal layer ML1 includes at least one of titanium and titanium nitride, the second metal layer ML2 includes silver, and the third metal layer ML3 includes titanium nitride.

The pixel defining layer PDL may be disposed on the via insulating layer VIA and the pixel electrode PE. The pixel defining layer PDL may define an opening OP penetrating the pixel defining layer PDL and connected to the trench TR in the non-light emitting area NLA. In addition, the pixel defining layer PDL may expose at least a portion of the pixel electrode PE.

The pixel defining layer PDL may include a first pixel defining layer PDL1 disposed on the via insulating layer VIA and ends of the pixel electrode PE, a second pixel defining layer PDL2 disposed on the first pixel defining layer PDL1, and a third pixel defining layer PDL3 disposed on the second pixel defining layer PDL2. The first, second, and third pixel defining layers PDL1, PDL2 and PDL3 may form steps. In some embodiments, each of the first pixel defining layer PDL1 and the third pixel defining layer PDL3 includes silicon nitride, and the second pixel defining layer PDL2 includes silicon oxide.

The light emitting layer EL may be disposed on the pixel electrode PE and the pixel defining layer PDL. In addition, the light emitting layer EL may fill at least a portion of the trench TR of the via insulating layer VIA and the opening OP of the pixel defining layer PDL. That is, the light emitting layer EL may be entirely disposed in the first, second, and third light emitting areas LA1, LA2, and LA3 and the non-light emitting area NLA.

The light emitting layer EL may include an organic light emitting layer including an organic material and an auxiliary layer. The auxiliary layer may include at least one of a hole injection layer, a hole transport layer, an electron transport layer, and an electron injection layer.

In some embodiments, the light emitting layer EL includes a hole injection layer HIL, a first hole transport layer HTL1, a first light emitting layer EML1, a first electron transport layer ETL1, a charge generation layer CGL, a second hole transport layer HTL2, a second light emitting layer EML2, a second electron transport layer ETL2, and an electron injection layer EIL. The charge generation layer CGL may include an n-type charge generation layer nCGL and a p-type charge generation layer pCGL.

The first light emitting layer EML1 and the second light emitting layer EML2 may emit light in different wavelength bands. Accordingly, the light emitting layer EL may emit white light. For example, the first light emitting layer EML1 may emit light in a yellow wavelength band, and the second light emitting layer EML2 may emit light in a blue wavelength band, but the present disclosure is not limited thereto.

In FIG. 15, the light emitting layer EL is illustrated as including two hole transport layers HTL1 and HTL2, two electron transport layers ETL1 and ETL2 and one charge generation layer CGL, but the present disclosure is not limited thereto. In some examples, the light emitting layer EL may include three or more hole transport layers, three or more electron transport layers, and two or more charge generation layers. In addition, a stacking order of the light emitting layer EL and types of stacked layers may be changed in various suitable ways.

The charge generation layer CGL may be disconnected in the non-light emitting area NLA by the trench TR. That is, the charge generation layer CGL may be disconnected between the first, second, and third light emitting areas LA1, LA2, and LA3 that are adjacent to (e.g., closest to) each other. Accordingly, a leakage current that may occur between the first, second, and third light emitting areas LA1, LA2, and LA3 that are adjacent to (e.g., closest to) each other may be minimized or substantially reduced.

The common electrode CE may be disposed on the light emitting layer EL. The common electrode CE may be entirely disposed in the first, second, and third light emitting areas LA1, LA2, and LA3 and the non-light emitting area NLA.

The encapsulation layer TFE may be disposed on the common electrode CE. The encapsulation layer TFE may prevent impurities, moisture, external air, and/or the like from penetrating into the light emitting element LD from the outside, or substantially reduce incidences thereof.

The color filter layer CFL may be disposed on the encapsulation layer TFE. The color filter layer CFL may include a light blocking portion BM, a first color filter CF1, a second color filter CF2, and a third color filter CF3.

The light blocking portion BM may overlap the non-light emitting area NLA. The light blocking portion BM may define a plurality of openings dividing the first, second, and third light emitting areas LA1, LA2, and LA3. The light blocking portion BM may include an organic material and/or an inorganic material including black pigment, black dye, and/or the like.

The first, second, and third color filters CF1, CF2 and CF3 may be disposed within the openings defined by the light blocking portion BM. That is, the first color filter CF1 may overlap the first light emitting area LA1, the second color filter CF2 may overlap the second light emitting area LA2, and the third color filter CF3 may overlap the third light emitting area LA3.

The first color filter CF1 may convert light emitted from the light emitting layer EL into first light, the second color filter CF2 may convert the light emitted from the light emitting layer EL into second light, and the third color filter CF3 may convert the light emitted from the light emitting layer EL into third light. For example, the first light may be light in a red wavelength band, the second light may be light in a blue wavelength band, and the third light may be light in a green wavelength band, but the present disclosure is not limited thereto.

The present disclosure can be applied to various suitable display devices. For example, the present disclosure is applicable to various display devices such as display devices for vehicles, ships and aircraft, portable communication devices, display devices for exhibition or information transmission, medical display devices, and the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

When one or more embodiments may be implemented differently, a specific process order may be performed differently from the described order. For example, (i) the disclosed operations of a process are merely examples, and may involve various additional operations not explicitly covered, and (ii) the temporal order of the operations may be varied.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of embodiments and is not to be construed as limiting thereof. Although a few embodiments have been described, those skilled in the art will readily appreciate that many modifications are possible in the embodiments without materially departing from the novel teachings and features of the present inventive concept. Accordingly, all such modifications are intended to be included within the scope of the present inventive concept as defined by the claims and equivalents thereof. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims and equivalents thereof.

What is claimed is:

1. A display device comprising:

a substrate comprising a first light emitting area, a second light emitting area adjacent to the first light emitting area, and a non-light emitting area between the first light emitting area and the second light emitting area;

a via insulating layer on the substrate and defining a trench recessed from an upper surface of the via insulating layer in the non-light emitting area;

a pixel electrode in the first light emitting area and the second light emitting area and on the via insulating layer, and comprising:
a first metal layer comprising at least one of titanium (Ti) or titanium nitride (TiN);
a second metal layer on the first metal layer and comprising a metal material; and
a third metal layer on the second metal layer and comprising titanium nitride; and
a pixel defining layer on the via insulating layer and the pixel electrode, exposing at least a portion of the pixel electrode, and defining an opening to the trench,
wherein the substrate comprises:
a base substrate defining a plurality of grooves and comprising a silicon wafer; and
a plurality of pixel circuits each accommodated in the plurality of grooves.

2. The display device of claim 1, wherein the pixel electrode comprises:
a first area overlapping the pixel defining layer in a plan view; and
a second area exposed by the pixel defining layer, and
wherein a thickness of a portion of the third metal layer overlapping the second area is thinner than a thickness of a portion of the third metal layer overlapping the first area.

3. The display device of claim 2, wherein the thickness of the portion of the third metal layer overlapping the second area is about 30 Å to about 60 Å.

4. The display device of claim 1, wherein the pixel defining layer comprises:
a first pixel defining layer on the via insulating layer and the pixel electrode;
a second pixel defining layer on the first pixel defining layer; and
a third pixel defining layer on the second pixel defining layer.

5. The display device of claim 4, wherein the first pixel defining layer covers a side surface of the pixel electrode.

6. The display device of claim 4, wherein a side surface of the first pixel defining layer protrudes more in a direction toward a center of the pixel electrode than a side surface of the second pixel defining layer, and
wherein the side surface of the second pixel defining layer protrudes more in the direction toward the center of the pixel electrode than a side surface of the third pixel defining layer.

7. The display device of claim 4, wherein each of the first pixel defining layer and the third pixel defining layer comprises an inorganic material different from the second pixel defining layer.

8. The display device of claim 7, wherein each of the first pixel defining layer and the third pixel defining layer comprises silicon nitride ($SiN_x$), and the second pixel defining layer comprises silicon oxide ($SiO_x$).

9. A display device comprising:
a substrate comprising a first light emitting area, a second light emitting area adjacent to the first light emitting area, and a non-light emitting area between the first light emitting area and the second light emitting area;
a via insulating layer on the substrate and defining a trench recessed from an upper surface of the via insulating layer in the non-light emitting area;
a pixel electrode in the first light emitting area and the second light emitting area and on the via insulating layer, and comprising:
a first metal layer comprising at least one of titanium (Ti) or titanium nitride (TiN);
a second metal layer on the first metal layer and comprising a metal material; and
a third metal layer on the second metal layer and comprising titanium nitride;
a pixel defining layer on the via insulating layer and the pixel electrode, exposing at least a portion of the pixel electrode, and defining an opening to the trench; and
a light emitting layer on the pixel electrode and the pixel defining layer,
wherein the light emitting layer comprises a charge generation layer disconnected in the non-light emitting area by the trench.

10. The display device of claim 9, further comprising:
a common electrode on the light emitting layer,
wherein the common electrode is entirely in the first light emitting area, the second light emitting area, and the non-light emitting area.

11. A method of manufacturing a display device, the method comprising:
forming a via insulating layer on a substrate, the substrate comprising a first light emitting area, a second light emitting area adjacent to the first light emitting area, and a non-light emitting area between the first light emitting area and the second light emitting area;
forming a pixel electrode in each of the first light emitting area and the second light emitting area on the via insulating layer;
forming a preliminary pixel defining layer on the via insulating layer and the pixel electrode;
forming an opening penetrating the preliminary pixel defining layer and a trench recessed from an upper surface of the via insulating layer and connected to the opening by removing a portion of each of the preliminary pixel defining layer and the via insulating layer in the non-light emitting area; and
forming a pixel defining layer exposing at least a portion of the pixel electrode by removing a portion of the preliminary pixel defining layer.

12. The method of claim 11, wherein the forming of the pixel electrode comprises:
forming a preliminary first metal layer on the via insulating layer;
forming a preliminary second metal layer on the preliminary first metal layer;
forming a preliminary third metal layer on the preliminary second metal layer; and
forming a first metal layer, a second metal layer, and a third metal layer by removing a portion of each of the preliminary first metal layer, the preliminary second metal layer and the preliminary third metal layer.

13. The method of claim 12, wherein the first metal layer comprises at least one of titanium or titanium nitride,
wherein the second metal layer comprises silver, and
wherein the third metal layer comprises titanium nitride.

14. The method of claim 12, wherein the forming of the preliminary pixel defining layer comprises:
forming a preliminary first pixel defining layer on the via insulating layer and the pixel electrode;
forming a preliminary second pixel defining layer on the preliminary first pixel defining layer; and
forming a preliminary third pixel defining layer on the preliminary second pixel defining layer.

15. The method of claim 14, wherein the forming of the pixel defining layer comprises:

forming a third pixel defining layer by removing a portion of the preliminary third pixel defining layer;

forming a second pixel defining layer comprising a side surface that protrudes more in a direction toward a center of the pixel electrode than a side surface of the third pixel defining layer by removing a portion of the preliminary second pixel defining layer; and forming a first pixel defining layer comprising a side surface that protrudes more in the direction toward the center of the pixel electrode than the side surface of the second pixel defining layer by removing a portion of the preliminary first pixel defining layer.

16. The method of claim 15, wherein each of the first pixel defining layer and the third pixel defining layer comprises an inorganic material different from the second pixel defining layer.

17. The method of claim 16, wherein each of the first pixel defining layer and the third pixel defining layer comprises silicon nitride, and the second pixel de- fining layer comprises silicon oxide.

18. The method of claim 15, wherein the pixel electrode comprises: a first area overlapping the pixel defining layer in a plan view; and a second area exposed by the pixel defining layer.

19. The method of claim 18, wherein in the forming of the first pixel defining layer, a portion of the third metal layer overlapping the second area is removed, and a portion of the third metal layer overlapping the second area is formed to have a thinner thickness than a portion of the third metal layer overlapping the first area.

* * * * *